United States Patent [19]
Oh et al.

[11] Patent Number: 5,923,568
[45] Date of Patent: Jul. 13, 1999

[54] DISTRIBUTED CAPACITANCE ESTIMATIONS OF INTERCONNECTS WITHIN INTEGRATED CIRCUITS

[75] Inventors: Soo-Young Oh, Fremont; Kent Okasaki, Santa Clara; John L. Moll, Los Altos, all of Calif.

[73] Assignee: Hewlett-Packard Company, Palo Alto, Calif.

[21] Appl. No.: 08/831,443

[22] Filed: Mar. 31, 1997

[51] Int. Cl.[6] ........................................... G06F 17/50
[52] U.S. Cl. .................... 364/490; 364/488; 395/300.35; 395/500.06
[58] Field of Search ..................... 364/578, 490, 364/491, 488; 702/57

[56] References Cited

U.S. PATENT DOCUMENTS

| | | | |
|---|---|---|---|
| 5,610,833 | 3/1997 | Chang et al. | 364/491 |
| 5,706,206 | 1/1998 | Hammer et al. | 364/491 |

OTHER PUBLICATIONS

Arora et al., "Modeling and Extraction of Interconnect Capacitances for Multilayer VLSI Circuits" IEEE Transactions on Computer Aided Design of Integrated Circuits and Systems, v. 15, n. 1 pp. 58–67, Jan. 1996.

Raphael—Interconnect Analysis Program; Version 2.1; Integrated Circuit Business Division, Palo Alto—Hewlett–Packard Company; Aug. 17, 1993.

*Primary Examiner*—Melanie A. Kemper
*Attorney, Agent, or Firm*—Brian R. Short

[57] ABSTRACT

A method of estimating the distributed capacitance of an interconnection line within an integrated circuit. The invention includes a method for estimating distributed capacitance between interconnection lines within an integrated circuit. The integrated circuit is modeled as including a middle plane which is planar and adjacent to a top plane and a bottom plane. Each plane includes a plurality of interconnection lines which are infinite in length and parallel. The interconnection lines of the middle plane are orthogonal to the interconnection lines of the top plane and the interconnection lines of the bottom plane. A ground plane is adjacent and planar to the bottom plane. A first value of capacitance between an interconnection line of the middle plane and an interconnection line of the top plane is estimated ignoring the effects of the bottom plane. A second value of capacitance between the interconnection line of the middle plane and the interconnection line of the top plane is estimated assuming the bottom plane is a solid conductive sheet. An actual value of capacitance between the interconnection line of the middle plane and the interconnection line of the top plane is estimated by interpolating between the first value of capacitance and the second value of capacitance. The invention simplifies the required calculations by breaking a three array structure into two separate two array structures. Similarly, an actual value of capacitance between the interconnection line of the middle plane and the ground plane, an actual value of capacitance between the interconnection line of the middle plane and an interconnection line of the bottom plane, and an actual value of capacitance between two interconnection lines of the middle plane can be estimated.

13 Claims, 7 Drawing Sheets

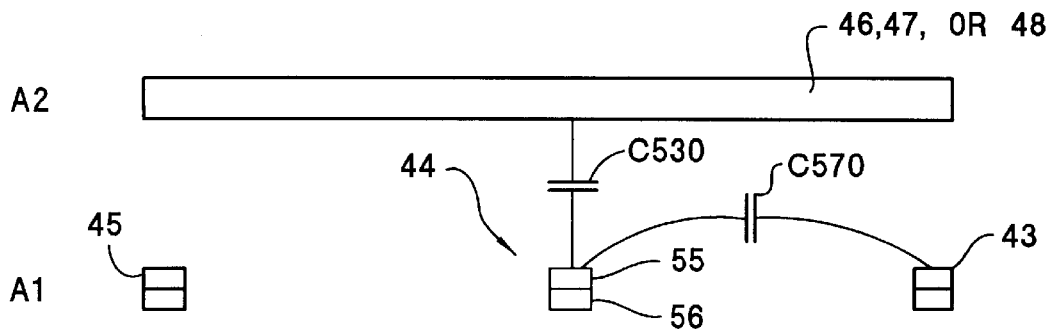
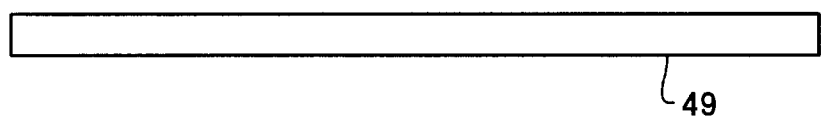
Figure 8
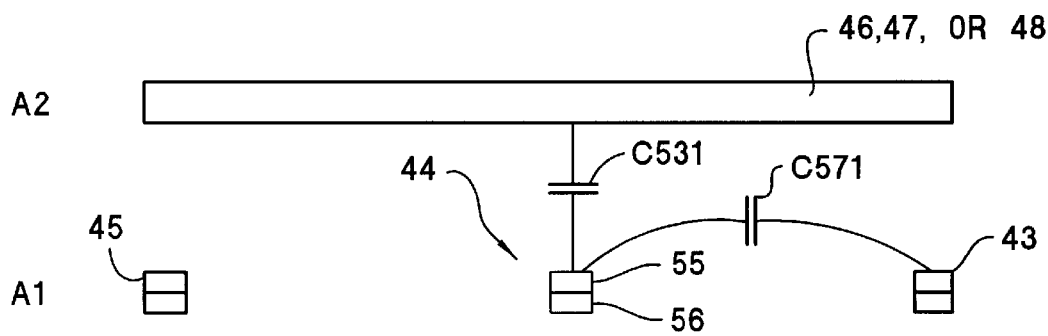
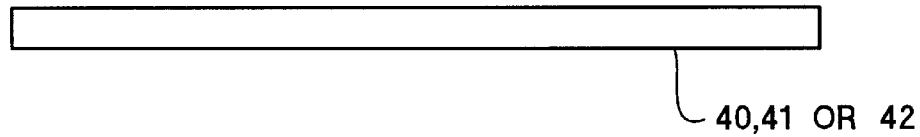
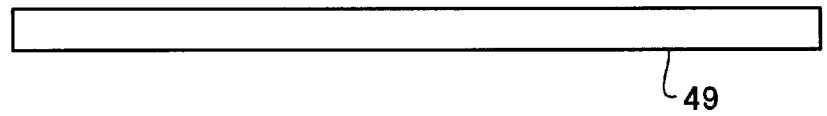
Figure 9

ESTIMATE THE VALUE C520 OF THE STRUCTURE SHOWN IN FIGURE 6
↓
ESTIMATE THE VALUE C521 OF THE STRUCTURE SHOWN IN FIGURE 7
↓
ESTIMATE THE VALUE C52 OF THE STRUCTURE SHOWN IN FIGURE 4 BY SUMMING A RATIO OF THE VALUE OF C520 WITH A RATIO OF THE VALUE C521 WHERE THE RATIO IS DEPENDENT ON THE STRUCTURE OF PLANE A1
↓
ESTIMATE THE VALUE C510 OF THE STRUCTURE SHOWN IN FIGURE 6
↓
ESTIMATE THE VALUE C511 OF THE STRUCTURE SHOWN IN FIGURE 7
↓
ESTIMATE THE VALUE C51 OF THE STRUCTURE SHOWN IN FIGURE 4 BY SUMMING A RATIO OF THE VALUE OF C510 WITH A RATIO OF THE VALUE C511 WHERE THE RATIO IS DEPENDENT ON THE STRUCTURE OF PLANE A1
↓
ESTIMATE THE VALUE C580 OF THE STRUCTURE SHOWN IN FIGURE 6
↓
ESTIMATE THE VALUE C581 OF THE STRUCTURE SHOWN IN FIGURE 7
↓
ESTIMATE THE VALUE C58 OF THE STRUCTURE SHOWN IN FIGURE 5 BY SUMMING A RATIO OF C580 WITH A RATIO OF THE C581 WHERE THE RATIO IS DEPENDENT ON THE STRUCTURE OF PLANE A1 STRUCTURE OF PLANE A1
↓
ESTIMATE THE VALUE C530 OF THE STRUCTURE SHOWN IN FIGURE 8
↓
ESTIMATE THE VALUE C531 OF THE STRUCTURE SHOWN IN FIGURE 9
↓
ESTIMATE THE VALUE C53 OF THE STRUCTURE SHOWN IN FIGURE 4 BY SUMMING A RATIO OF THE VALUE OF C530 WITH A RATIO OF THE VALUE C531 WHERE THE RATIO IS DEPENDENT ON THE STRUCTURE OF PLANE A3
↓
ESTIMATE THE VALUE C570 OF THE STRUCTURE SHOWN IN FIGURE 8
↓
ESTIMATE THE VALUE C571 OF THE STRUCTURE SHOWN IN FIGURE 9
↓
ESTIMATE THE VALUE C57 OF THE STRUCTURE SHOWN IN FIGURE 5 BY SUMMING A RATIO OF THE VALUE OF C570 WITH A RATIO OF THE VALUE C571 WHERE THE RATIO IS DEPENDENT ON THE STRUCTURE OF PLANE A3
↓
ESTIMATE THE VALUE C50 OF THE STRUCTURE SHOWN IN FIGURE 4 BY SUMMING THE VALUE OF C57 WITH THE VALUE OF C58

*Figure 10*

DISTRIBUTED CAPACITANCE ESTIMATIONS OF INTERCONNECTS WITHIN INTEGRATED CIRCUITS

FIELD OF INVENTION

This invention relates generally to a method of estimating distributed capacitance associated with interconnection lines within an integrated circuit. In particular, it relates to a method of generating 3 dimensional (3D) estimations of interconnection line distributed capacitance including interlayer fringing and interline coupling capacitance.

BACKGROUND

Computer aided design (CAD) software is used by digital electronic system designers to predict the behavior of digital electronic systems before fabricating integrated circuits containing the digital electronic systems. Very large-scale integration (VLSI) allows large numbers of circuits to be packaged in small spaces. Due to the complexity involved with VLSI circuits, VLSI circuits must be simulated before fabricating the VLSI circuits on an integrated circuit chip. Successful implementation of VLSI circuits is impossible without computer simulation of the circuits.

A typical purpose of CAD is to estimate timing and delays associated with signals operating within integrated circuits. The speed at which signals within an integrated circuits can propagate can be limited by capacitance associated with the interconnection lines within the integrated circuit. Therefore, estimations of delays associated with the interconnections within the integrated circuit is critical.

FIG. 1 shows several interconnections lines within an integrated circuit. The interconnection lines are typically arranged in a planar configuration. For example, FIG. 1 includes a first plane P1, a second plane P2 and a third plane P3. The first plane P1 includes interconnection lines 10, 11, 12. The second plane P2 includes interconnection lines 13, 14, 15. The third plane P3 includes interconnection lines 16, 17, 18.

Typically, CAD programs use 2 dimensional (2D) estimations for distributed interconnection capacitance. FIG. 2 shows the capacitive effects accounted for in a 2D estimation of the distributed interconnection capacitance associated with an interconnection line 14. The 2D distributed interconnection capacitance includes capacitors C21, C22, C23, C24, C25, C26, C27 and C28. The capacitance is only estimated in the two dimensions shown.

FIG. 3 shows a top view of the same interconnection lines shown in FIG. 2. FIG. 3 shows the 3 dimensional (3D) fringing capacitances not accounted for in typical 2D capacitive estimations. The 3D fringing capacitance includes capacitors C29, C30, C31 and C32. Most conventional CAD programs ignore 3D fringing capacitance. However, 3D fringing capacitance can have a significant effect on multi-level interconnect capacitances for interconnection lines as shown in FIG. 1. Neglecting 3D fringing capacitances can cause 20–40% errors in estimations of interconnection line capacitance.

Full 3D numerical estimations of 3D capacitance of global interconnection lines have been implemented by CAD programs. However, these 3D estimations are very complex and require extremely large amounts of computer processing time. Capacitance estimations can take over ten hours for each interconnection line. VLSI integrated circuits require a large number of interconnection lines. Therefore, full 3D estimations of global interconnection line capacitance have not been practical in the design of VLSI integrated circuits.

It is desirable to have a method of estimating distributed capacitance of interconnections within integrated circuits which is more accurate than the 2D estimations presently used in CAD programs. Furthermore, the method of estimating distributed capacitance must not require excessive amounts of computer processing time.

SUMMARY OF THE INVENTION

The present invention provides a method of estimating 3D capacitance of interconnection lines within an integrated circuit. The method provides more accurate estimates that presently existing 2D estimation methods. Furthermore, the computer processing time required for the 3D estimations is substantially less than prior methods of estimating 3D capacitance of interconnection lines.

A first embodiment of this invention includes a method for estimating distributed capacitance between interconnection lines within an integrated circuit. The integrated circuit is modeled as including a middle plane which is planar and adjacent to a top plane and a bottom plane. Each plane includes a plurality of interconnection lines which are infinite in length and parallel. The interconnection lines of the middle plane are orthogonal to the interconnection lines of the top plane and the interconnection lines of the bottom plane. A ground plane is adjacent and planar to the bottom plane. A first value of capacitance between an interconnection line of the middle plane and an interconnection line of the top plane is estimated ignoring the effects of the bottom plane. A second value of capacitance between the interconnection line of the middle plane and the interconnection line of the top plane is estimated assuming the bottom plane is a solid conductive sheet. An actual value of capacitance between the interconnection line of the middle plane and the interconnection line of the top plane is estimated by interpolating between the first value of capacitance and the second value of capacitance. The invention simplifies the required calculations by breaking a three array structure into two separate two array structures.

Another embodiment of the invention is similar to the first embodiment, but includes estimating an actual value of capacitance between the interconnection line of the middle plane and the ground plane, estimating an actual value of capacitance between the interconnection line of the middle plane and an interconnection line of the bottom plane, and an actual value of capacitance between two interconnection lines of the middle plane.

Another embodiment of this invention provides a method of generating look-up table of capacitance delta values. The table is useful in a CAD system for designing integrated circuits. The table is generated by estimating the values of capacitances between interconnection lines in an assumed two-dimensional integrated circuit structure, estimating the values of capacitances between interconnection lines in a structure that is similar thereto except for the addition of three-dimensional features, calculating differences between the two-dimensional and three-dimensional estimated values, and arranging these differences in tabular form.

Another embodiment of the invention includes method for estimating 3D distributed capacitance between interconnection lines within an integrated circuit. The method includes selecting an interconnection line width, and selecting the spacing between adjacent interconnection lines. A 2D distributed capacitance value of the interconnection is estimated. A delta 3D distributed capacitance value is retrieved from a look up table. Finally, the 2D distributed capacitance value is added to the delta 3D capacitance value.

Another embodiment of the invention is an article of manufacture which includes a computer-readable medium and a plurality of computer instructions carried by the medium. The computer instructions include the first embodiment of the invention.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 8 shows another cross-sectional view of the interconnection lines shown in FIG. 4.

FIG. 9 shows another cross-sectional view of the interconnection lines shown in FIG. 4.

FIG. 10 is a flow chart of a method of calculating the distributed capacitance associated with an interconnection line within an integrated circuit.

DETAILED DESCRIPTION

Figure 1:
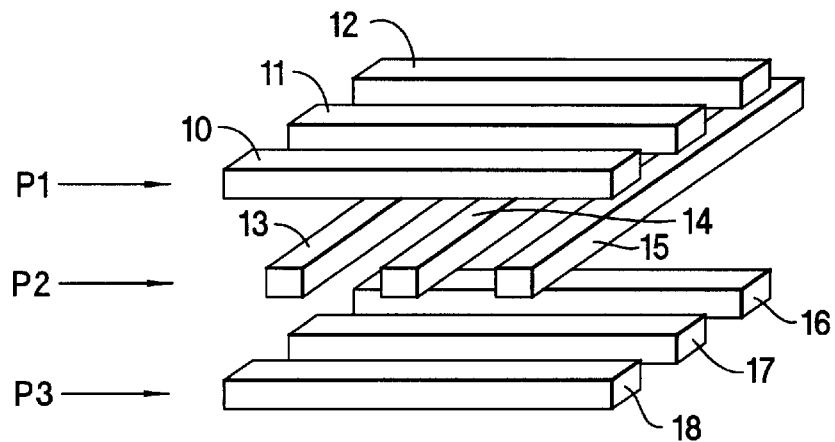
FIG. 1 shows several interconnection lines within an integrated circuit.
Figure 2:
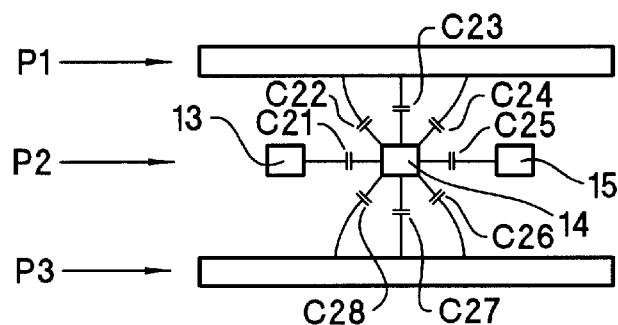
FIG. 2 shows a cross-sectional view of the interconnections shown in FIG. 1 depicting 2D capacitances typically calculated by CAD programs for estimating the distributed capacitance of an interconnection line.
Figure 3:
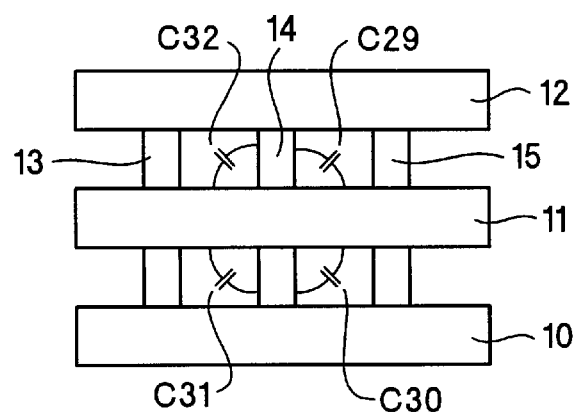
FIG. 3 shows a top view of the interconnections shown in FIG. 1 depicting 3D fringing capacitances typically ignored in estimations of the distributed capacitance of an interconnection line.

As shown in the drawings for purposes of illustration, the invention is embodied in a method for time efficiently determining estimations of 3D capacitance associated with interconnections of integrated circuits. The method of estimating 3D interconnect capacitance is more accurate than existing methods of estimating interconnect capacitance.

This invention is generally used for designing integrated circuits. During the process of designing an integrated circuit, the integrated circuit is modeled and simulated with CAD software to predict the performance of the integrated circuit. This invention can be included within the CAD software to enable accurate simulations of the signal delays within the integrated circuit caused by capacitance of interconnection lines within the integrated circuit. CAD software which includes this invention can be stored on a computer-readable storage medium.

Figure 4:
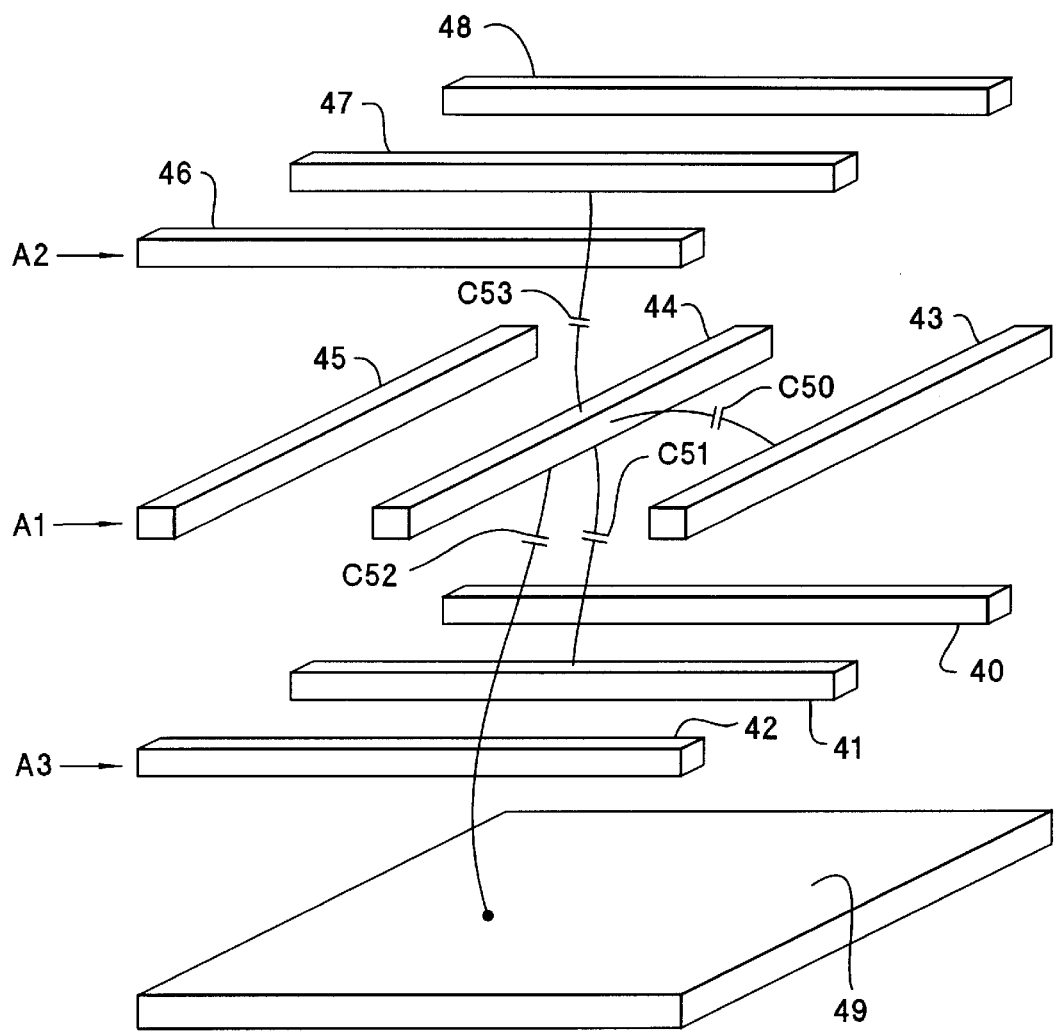
FIG. 4 shows an array of interconnection lines.

A first embodiment of this invention includes modeling the interconnection lines of an integrated circuit as shown in FIG. 4. The model includes a first plane A1. The first plane A1 includes a plurality of parallel and infinitely long interconnection lines 43, 44, 45. The model also includes a second plane A2 adjacent and planar to the first plane A1. The second plane A2 includes a plurality of parallel and infinitely long interconnection lines 46, 47, 48. The interconnection lines 46, 47, 48 of the second plane A2 are orthogonal to the interconnection lines 43, 44, 45 of the first plane A1. The model also includes a third plane A3 adjacent and planar to the first plane A1. The third plane A3 includes a plurality of parallel and infinitely long interconnection lines 40, 41, 42. The interconnection line 40, 41, 42 of the third plane A3 are orthogonal to the interconnection lines 43, 44, 45 of the first plane A1. A ground plane 49 is adjacent and planar to the third plane A3. The interconnection lines on each individual plane A1, A2, A3 are approximated as being equally spaced. That is, the spacing between interconnection line 44 and interconnection line 43 is equal to the spacing between interconnection line 44 and interconnection line 45.

For explanatory purposes, it will be assumed that the second plane A2 is above the first plane A1, the third plane A3 is below the first plane A1, and the ground plane 49 is below the third plane A3. However, the structure of the integrated circuit being modeled is not limited to this orientation.

The structure shown in FIG. 4 is typically a sub-section of a larger structure which includes more interconnection lines. A dielectric is located between the interconnection lines. The dielectric can be non-planar and inhomogeneous. Furthermore, the spacing between the interconnection lines and the width of each of the interconnection lines can vary depending on the integrated circuit structure being modeled or approximated.

The interconnection lines of each plane are approximated as being orthogonal to the interconnection lines of adjacent planes. For example, the interconnection lines 43, 44 and 45 are orthogonal to the interconnection lines 40, 41 and 42 of a first plane and interconnection lines 46, 47 and 48 of a second plane. This approximation reduces the coupling capacitance and coupling noise between adjacent interconnection lines.

The capacitance associated with a selected interconnection line 44 can be approximated by calculating four different values of capacitances C50, C51, C52 and C53. A first capacitance C50 represent the capacitance between the select interconnection line 44 of the first plane A1 and another interconnection line 43 of the first plane A1. A second capacitance C51 represents the capacitance between the select interconnection line 44 of the first plane A1 and an interconnection line 41 of the third plane A3. A third capacitance C52 represent the capacitance between the select interconnection line 44 of the first plane A1 and the ground plane 49. A fourth capacitance C53 represents the capacitance between the select interconnection line 44 of the first plane A1 and an interconnection line 47 of the second plane A2.

With the previously stated approximations and assuming that the structure shown in FIG. 4 is a sub-section of a structure that includes an infinite number of interconnection lines, the capacitance between interconnection line 44 and interconnection line 41 is the same as the capacitance between selected interconnection line 44 and interconnection line 40 or interconnection line 42. The capacitance between select interconnection line 44 and interconnection line 43 is equal to the capacitance between select interconnection line 44 and interconnection line 45. The capacitance between select interconnection line 44 and interconnection line 47 is the same as the capacitance between select interconnection line 44 and interconnection line 46 or interconnection line 48. That is, approximations of the four described capacitances C50, C51, C52 and C53, provide enough information that the capacitance between the select interconnection line 44 and any of the other interconnections is easily determined.

Interconnections on planes not adjacent to the first plane A1 containing the select interconnect line 44 are approximated by the ground plane 49. The capacitance C52 between the select interconnection line 44 of the first plane A1 and the ground plane 49 represents the capacitance between interconnection line 44 and all other interconnection lines located below the interconnection lines 40, 41 and 42 of the third plane A3. Another capacitance between interconnection line 44 and a second ground plane located above the second plane A2 may be included to approximate the capacitance between the interconnection line 44 and all other interconnection lines located above the interconnection lines 46, 47 and 48 of the second plane A2. The following analysis for estimating the value of the capacitance C52 may be used for estimating the capacitance between the interconnections lines and the second ground plane.

Figure 5:
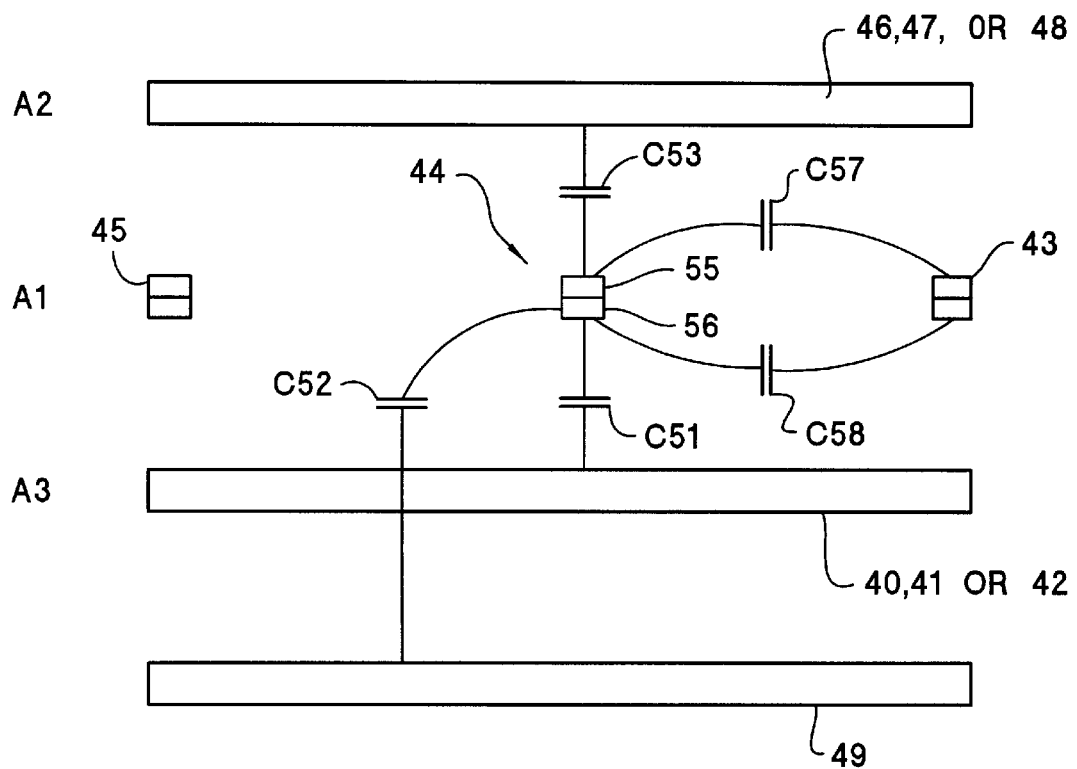
FIG. 5 shows a cross-sectional view of the interconnection lines shown in FIG. 4.

FIG. 5 is a cross-sectional view of the array shown in FIG. 4. The interconnection lines 46, 47 and 48 form the second plane A2. The interconnection lines 43, 44 and 45 form the first plane A1. The interconnection lines 40, 41 and 42 form the third plane A3. This embodiment includes the approximation that the electrical fields above a plane of interconnection lines are negligibly affected by the electric fields below the plane of interconnection lines. For example, the electric fields above the interconnection line 44 are only slightly affected by the electric fields below the interconnection line 44. Therefore, for the purposes of calculating the capacitances above and below the interconnection line 44, the interconnection line 44 can be divided into an upper section 55 and a lower section 56 as shown in FIG. 5. The capacitance C50 must be divided into two separate capacitances C57 and C58 which approximate the capacitance between the lower section 56 of interconnection line 44 of the first plane A1 and the lower section of the other interconnection line 43 of the first plane A1, and the capacitance between the upper section 55 of interconnection line 44 of the first plane A1 and the upper section of the other interconnection line 43 of the first plane A1. The value of capacitance C50 between the interconnection line 44 of the first plane A1 and the other interconnection line 43 of the first plane A1 can be calculated by adding the value of capacitance C57 to the value of capacitance C58. The capacitances C53 and C57 above the interconnection line 44 can be calculated with the exact structure geometry above the interconnection line 44 and with an approximate structure geometry below the interconnection line 44. The capacitances C51, C52 and C58 below the interconnection line 44 can be calculated with the exact structure geometry below the interconnection line 44 and an approximate structure geometry above the interconnection line 44.

Figure 6:
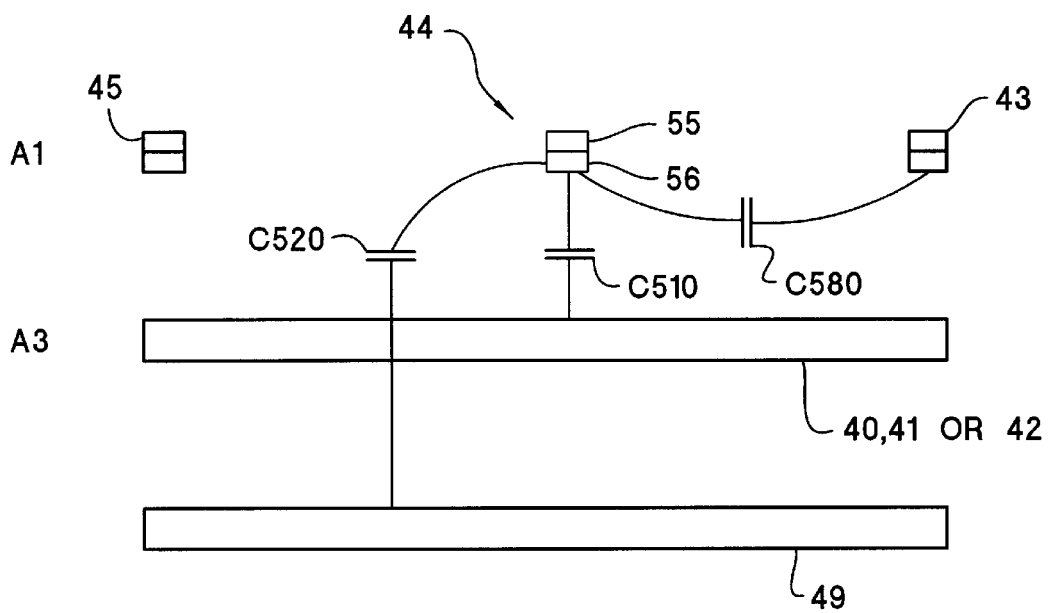
FIG. 6 shows another cross-sectional view of the interconnection lines shown in FIG. 4.
Figure 7:
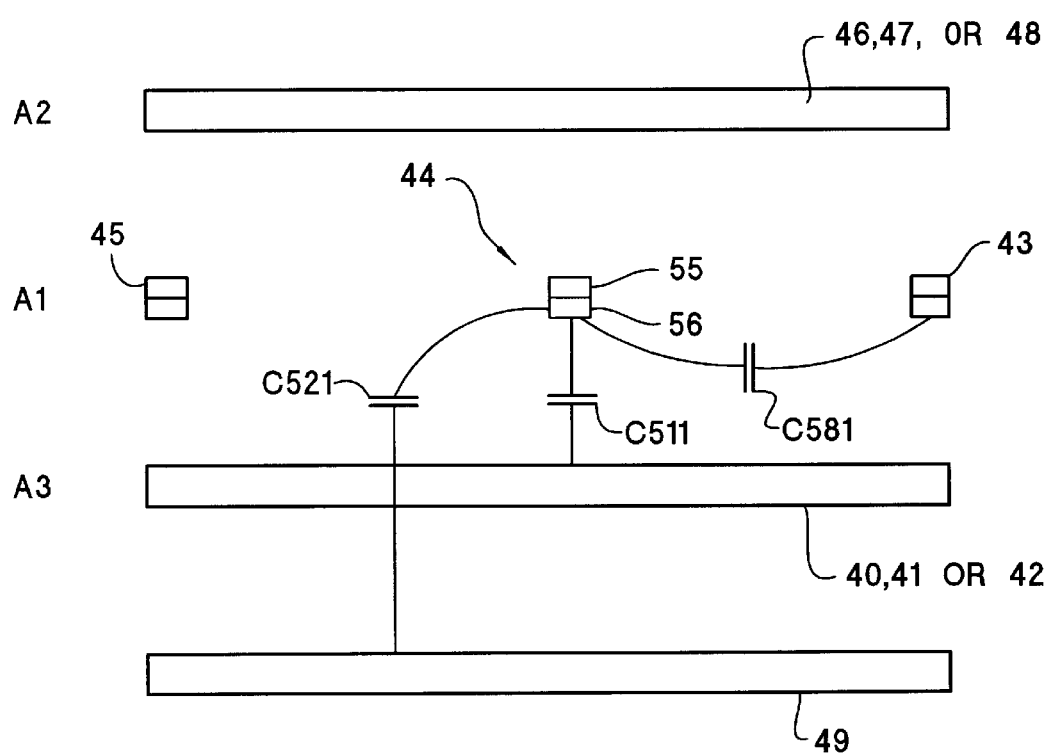
FIG. 7 shows another cross-sectional view of the interconnection lines shown in FIG. 4.

FIG. 6 and FIG. 7 provide the integrated circuit structures required to calculate approximations of the lower values of capacitance C51, C52 and C58. FIG. 6 shows a cross-sectional view of the interconnection array in which the cross-sectional view does not include the interconnection lines 46, 47 or 48 of the second plane A2. That is, FIG. 6 depicts a cross-sectional view of the interconnection array in which the second plane A2 is non-existent. The capacitance between the lower section 56 of the select interconnection line 44 of first plane A1 and the ground plane 49 is designated by a capacitor C520. The capacitance between the lower section 56 of the select interconnection line 44 of first plane A1 and the interconnection line 41 of the third plane A3 is designated by a capacitor C510. The capacitance between the lower section 56 of the select interconnection line 44 of first plane A1 and the lower section of the other interconnection line 43 of the first plane A1 is designated by the capacitor C580.

FIG. 7 is cross-sectional view of the interconnection array in which the second plane A2 is a solid conductive plane. The capacitance between the lower section 56 of the select interconnection line 44 of first plane A1 and the ground plane 49 is designated by a capacitor C521. The capacitance between the lower section 56 of the select interconnection line 44 of first plane A1 and the interconnection line 41 of the third plane A3 is designated by a capacitor C511. The capacitance between the lower section 56 of the select interconnection line 44 of first plane A1 and the lower section of the other interconnection line 43 of the first plane A1 is designated by the capacitor C581.

Approximations of the values of the lower capacitances C51, C52 and C58 can be made from the structures of FIG. 6 and FIG. 7. Specifically, $$C51=C510*(1-FILLIN1)+C511*(FILLIN1),$$

$$C52=C520*(1-FILLIN1)+C521*(FILLIN1), \text{ and}$$

$$C58=C580*(1-FILLIN1)+C581*(FILLIN1).$$

The variable FILLIN1 is a number that represent a percentage or ratio of the first plane A1 that is "filled-in" with conductive material. If the first plane A1 is a solid conductive plane, then FILLIN1=1. If the first plane A1 is non-existent, then FILLIN1=0. If the width of the interconnection lines 46, 47 and 48 is equal to the spacing between the interconnection lines 46, 47 and 48, then FILLIN1=0.5.

The values of the capacitors C510, C520 and C580 are calculated using presently existing full 3D numerical capacitance estimation methods such as recited in the TMA Raphael reference manual, in which the structure simulated is the integrated circuit structure of FIG. 6. The values of the capacitors C511, C521 and C581 are also calculated using presently existing full 3D numerical capacitance estimation methods in which the integrated circuit structure simulated is the structure of FIG. 7. The invention simplifies the calculations by breaking the three array structure of FIG. 5 into the two separate two array structures of FIG. 6 and FIG. 7.

FIG. 8 and FIG. 9 provide the integrated circuit structures required to calculate approximations of the upper values of capacitance C53 and C57. FIG. 8 is a cross-sectional view of the interconnection array in which the cross-sectional view does not include the interconnection lines 40, 41 and 43 of the third plane A3. That is, FIG. 8 depicts a cross-section in which the third plane A3 is non-existent. The capacitance between the top section 55 of the select interconnection 44 of the first plane A1 and the interconnection 47 of the second plane A2 is designated by a capacitor C530. The capacitance between the top section 55 of the select interconnection 44 of the first plane A1 and the top section of the other interconnection line 43 of the first plane A1 is designated by a capacitor C570.

FIG. 9 shows a cross-sectional view of the interconnection array in which the first plane A1 is a solid conductive plane. The capacitance between the top section 55 of the select interconnection 44 of the first plane A1 and the interconnection 47 of the second plane A2 is designated by a capacitor C531. The capacitance between the top section 55 of the select interconnection 44 of the first plane A1 and the top section of the other interconnection line 43 of the first plane A1 is designated by a capacitor C571.

Approximations of the values of the lower capacitances C53 and C57 can be made from the structures of FIG. 8 and FIG. 9. Specifically, $$C53=C530*(1-FILLIN2)+C531*(FILLIN2), \text{ and}$$

$$C57=C570*(1-FILLIN2)+C571*(FILLIN2).$$

The variable FILLIN2 is a number that represent a percentage or ratio of the third plane A3 that is "filled-in" with conductive material. If the third plane A3 is a solid conductive plane, then FILLIN2=1. If the third plane A3 is non-existent, then FILLIN2=0. If the width of the interconnection lines 40, 41 and 42 is equal to the spacing between the interconnection lines 40, 41 and 42, then FILLIN2=0.5.

The values of the capacitors C530 and C570 are calculated using presently existing full 3D numerical capacitance estimation methods such as recited in the TMA Raphael reference manual, in which the structure simulated is the structure of FIG. 8. The values of the capacitors C531 and C571 are also calculated using presently existing full 3D numerical capacitance estimation methods in which the structure simulated is the structure of FIG. 9. The invention has simplified the calculations by breaking the three array structure of FIG. 5 into the two separate two array structures of FIG. 8 and FIG. 9.

The value of the capacitance C50 of FIG. 4 is calculated by adding the value of the capacitance C57 with the value of the capacitance C58.

FIG. 10 is a flow chart depicting the steps of calculating interconnection capacitance included within this embodiment of the invention.

Figure 11:
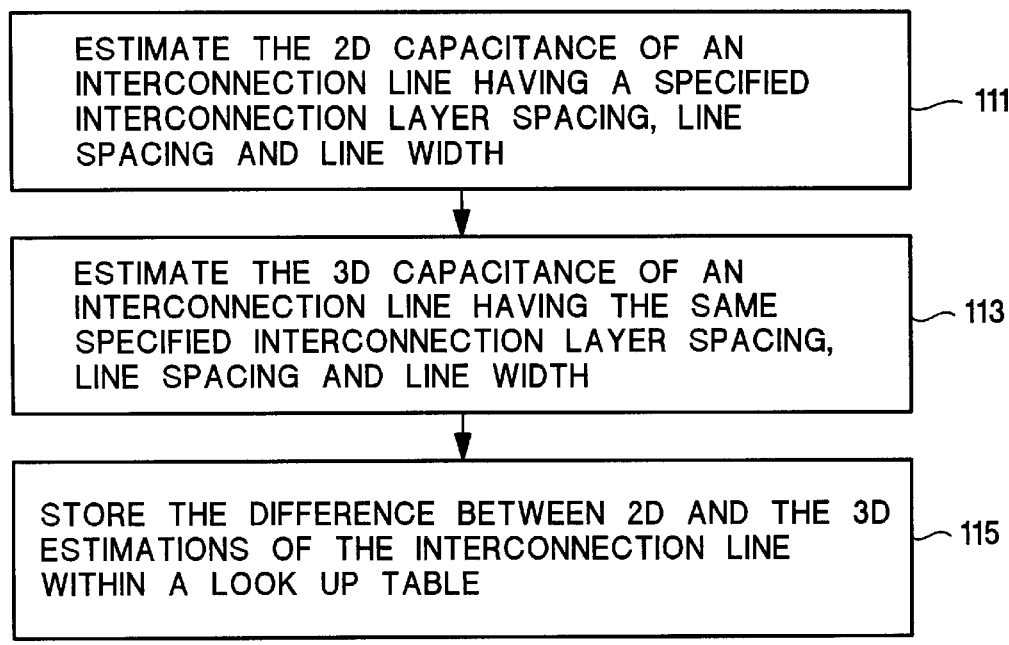
FIG. 11 is a flow chart of a method of calculating delta 3D capacitance estimations of interconnection lines.

FIG. 11 is a flow chart of another embodiment of the invention. This embodiment includes a method of generating a look up table which consists of values representing the difference between 3D capacitance estimated values and 2D capacitance estimated values. A first step 111 includes estimating a 2D capacitance of an interconnection line. A second step 113 includes estimating a 3D capacitance of the interconnection line. A third step 115 includes storing the difference between the 2D estimation and the 3D estimation in a look up table.

As was previously stated, presently existing CAD programs generate estimations of interconnection capacitance based on 2D structures. The invention provides accurate estimations based on 3D structures. A delta 3D look up table (LUT) is generated in which the difference between the 2D estimations of presently existing CAD programs and 3D estimations of the invention are stored in the LUT. That is, for a structure similar to the structure shown in FIG. 4, the difference between 2D interconnection capacitance estimations and 3D interconnection capacitance estimations is stored in a LUT.

The delta 3D values are dependent on the width of the interconnection lines and the spacing between the interconnection lines of each plane. Therefore, a library of delta 3D values are required for each variation in integrated circuit interconnection line width and spacing of each plane.

Figure 12:
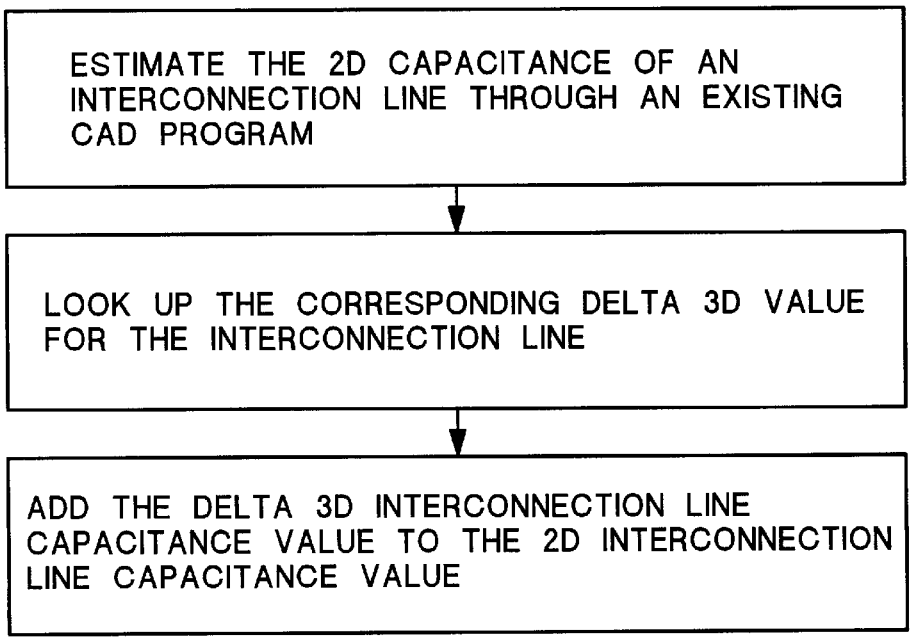
FIG. 12 is a flow chart of a method of estimating 3D values of interconnection capacitance by adding delta 3D capacitance values to 2D values generated by existing CAD programs.

FIG. 12 is a flow chart of another embodiment of this invention. This embodiment includes generating 2D estimations of integrated circuit interconnection capacitance through presently existing simulation methods. This embodiment further includes looking up a delta 3D value in the LUT which is added to the 2D estimation. The result is an accurate estimation of interconnection capacitance. There are three basic interconnect structures within an integrated circuit. The interconnect structures include cross-over interconnects, corner interconnects and vias. Typically, 95% of the interconnections within a microprocessor are cross-overs. Therefore, the processing time required to generated the 3D library can be minimized by only storing delta 3D values for cross-over interconnects.

Although specific embodiments of the invention have been described and illustrated, the invention is not to be limited to the specific forms or arrangements of parts so described and illustrated. The invention is limited only by the claims.

What is claimed is:

1. A method for estimating distributed capacitance between conductive interconnection lines within an integrated circuit, the method comprising:

modeling the integrated circuit as comprising a first plane, the first plane comprising a plurality of parallel and infinitely long interconnection lines, a second plane adjacent and planar to the first plane, the second plane comprising a plurality of parallel and infinitely long interconnection lines wherein the interconnection lines of the second plane are orthogonal to the interconnection lines of the first plane, a third plane adjacent and planar to the first plane, the third plane comprising a plurality of parallel and infinitely long interconnection lines wherein the interconnection lines of the third plane are orthogonal to the interconnection lines of the first plane, and a ground plane adjacent and planar to the third plane;

estimating a first value of capacitance between one of the interconnection line of the first plane and one of the interconnection lines of the second plane neglecting any effect of the third plane;

estimating a second value of capacitance between the interconnection line of the first plane and the interconnection line of the second plane while approximating the interconnection lines of the third plane as filled in with a solid conductive sheet; and estimating an actual value of capacitance between the interconnection line of the first plane and the interconnection line of the second plane by interpolating between the first value of capacitance and the second value of capacitance.

2. The method for estimating distributed capacitance between interconnection lines within an integrated circuit as recited in claim 1, further comprising:

estimating a third value of capacitance between the interconnection line of the first plane and the ground plane neglecting the effect of the second plane;

estimating a fourth value of capacitance between the interconnection line of the first plane and the ground plane while approximating the interconnection lines of the second plane as filled in with a solid conductive sheet; and estimating an actual value of capacitance between the interconnection line of the first plane and the ground plane by interpolating between the third value of capacitance and the fourth value of capacitance.

3. The method for estimating distributed capacitance between interconnection lines within an integrated circuit as recited in claim 1, wherein the step of estimating an actual value of capacitance between the interconnection line of the first plane and the interconnection line of the second plane comprises:

calculating a FILLIN2 value by determining the ratio between that portion of the surface area of the third plane which is occupied by interconnection lines and that portion of the surface area which is occupied by non-conducting material;

multiplying the first value of capacitance by (1−FILLIN2) yielding a first estimate;

multiplying the second value of capacitance by (FILLIN2) yielding a second estimate; and estimating an actual value of capacitance between the interconnection line of the first plane and the interconnection line of the second plane by adding the first estimate to the second estimate.

4. The method for estimating distributed capacitance between interconnection lines within an integrated circuit as recited in claim 2, wherein the step of estimating an actual value of capacitance between the interconnection line of the first plane and the ground plane comprises:

calculating a FILLIN1 value by determining the ratio between that portion of the surface area of the second plane which is occupied by interconnection lines and that portion of the surface area which is occupied by non-conducting material;

multiplying the third value with (1−FILLIN1) yielding a third estimate;

multiplying the fourth value with (FILLIN1) yielding a fourth estimate; and estimating an actual value of capacitance between the interconnection line of the first plane and the ground plane by adding the third estimate to the fourth estimate.

5. The method for estimating distributed capacitance between interconnection lines within an integrated circuit as recited in claim 1, further comprising:

estimating a fifth value of capacitance between the interconnection line of the first plane and one of the interconnection lines of the third plane neglecting any effects of the second plane;

estimating a sixth value of capacitance between the interconnection line of the first plane and the interconnection line of the third plane while approximating the interconnection lines of the second plane as filled in with a solid conductive sheet; and estimating an actual value of capacitance between the interconnection line of the first plane and the interconnection line of the third plane by interpolating between the fifth value of capacitance and the sixth value of capacitance.

6. The method for estimating distributed capacitance between interconnection lines within an integrated circuit as recited in claim 5, wherein the step of estimating an actual value of capacitance between the interconnection line of the first plane and the interconnection line of the third plane comprises:

calculating a FILLIN1 value by determining the ratio between that portion of the surface area of the second plane which is occupied by interconnection lines and that portion of the surface area which is occupied by non-conducting material;

multiplying the fifth value with (1−FILLIN1) yielding a fifth estimate;

multiplying the sixth value with (FILLIN1) yielding a sixth estimate; and estimating an actual value of capacitance between the interconnection line of the first plane and the interconnection line of the third plane by adding the fifth estimate to the sixth estimate.

7. The method for estimating distributed capacitance between interconnection lines within an integrated circuit as recited in claim 1, further comprising:

estimating a seventh value of capacitance between the interconnection line of the first plane and a second interconnection line of the first plane neglecting any effect of the second plane;

estimating an eighth value of capacitance between the interconnection line of the first plane and the second interconnection line while approximating the interconnection lines of the second plane as filled in with a solid conductive sheet;

estimating a ninth value of capacitance between the interconnection line of the first plane and the second interconnection line neglecting any effects of the third plane;

estimating a tenth value of capacitance between the interconnection line of the first plane and the second interconnection line while approximating the interconnection lines of the third plane as filled in with a solid conductive sheet; and estimating an actual value of capacitance between the interconnection line of the first plane and the second interconnection line by summing an interpolation between the seventh value of capacitance and the eighth value of capacitance with an interpolation between the ninth value of capacitance and the tenth value of capacitance.

8. The method for estimating distributed capacitance between interconnection lines within an integrated circuit as recited in claim 7, wherein the step of estimating an actual value of capacitance between the interconnection line of the first plane and the second interconnection line comprises:

calculating a FILLIN1 value by determining what ratio of the surface area of second plane is occupied by interconnection lines;

calculating a FILLIN2 value by determining what ratio of the surface area of third plane is occupied by interconnection lines;

multiplying the seventh value with (1−FILLIN1) yielding a seventh estimate;

multiplying the eighth value with (FILLIN1) yielding an eighth estimate;

multiplying the ninth value with (1−FILLIN2) yielding a ninth estimate;

multiplying the tenth value with (FILLIN2) yielding a tenth estimate; and estimating an actual value of capacitance between the interconnection line of the first plane and the second interconnection line by summing the seventh estimate, the eighth estimate, the ninth estimate and the tenth estimate.

9. A method of generating an integrated circuit interconnection capacitance delta 3D look up table for an array of interconnections lines within an integrated circuit, the method comprising:

selecting an interconnection width;

selecting a spacing between interconnection lines;

estimating 2D distributed capacitance values of a select interconnection line based on the selected interconnection width and the selected spacing between interconnection lines;

estimating 3D distributed capacitance values of the select interconnection line based on the selected interconnection width and the selected spacing between interconnection lines;

determining the difference between the 2D distributed capacitance values and the 3D distributed capacitance values; and storing the difference in a delta 3D look up table.

10. A method for estimating 3D distributed capacitance between interconnection lines within an integrated circuit, the method comprising:

selecting an interconnection line;

selecting an interconnection line width;

selecting a spacing between interconnection lines;

calculating a 2D distributed capacitance value of the selected interconnection line based on the selected interconnection width and the selected spacing between the interconnection lines;

looking up a delta 3D distributed capacitance value based on the selected interconnection width and the selected spacing between the interconnection lines; and estimating a 3D capacitance value by adding the 2D distributed capacitance value to the delta 3D capacitance value.

11. An article of manufacture comprising a computer-readable medium and a plurality of computer instructions carried by the medium, the instructions including:

an instruction that causes the computer to calculate a first capacitance value between a first interconnection line and a second interconnection line orthogonal to and spaced apart from the first interconnection line in an assumed integrate circuit structure in which the first interconnection line is one of a first plurality of parallel, coplanar interconnection lines and the second interconnection line is one of a second plurality of parallel, coplanar interconnection lines;

an instruction that causes the computer to calculate a second capacitive value between the first interconnection line and second interconnection line when a planar sheet of conducting material is disposed parallel to and spaced apart from the first plurality of interconnection lines such that the first plurality of interconnection lines is between the planar sheet of conducting material and the second plurality of interconnection lines; and an instruction that causes the computer to calculate an actual capacitance value by interpolating between the first and second capacitance values according to the ratio of conducting material to non-conducting material in a third plurality of interconnection lines disposed parallel to and spaced apart from the first plurality of interconnection lines in place of the planar sheet of conducting material.

12. An article of manufacture as in claim 11 wherein the computer-readable medium comprises magnetic material.

13. An article of manufacture as in claim 12 wherein the computer-readable medium comprises a floppy diskette.

* * * * *